(12) United States Patent
Yoneda et al.

(10) Patent No.: US 7,846,255 B2
(45) Date of Patent: Dec. 7, 2010

(54) PROCESSING EQUIPMENT FOR OBJECT TO BE PROCESSED

(75) Inventors: Masatake Yoneda, Nirasaki (JP); Shigeru Kasai, Nirasaki (JP); Masahiro Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 724 days.

(21) Appl. No.: 11/578,572

(22) PCT Filed: Apr. 14, 2005

(86) PCT No.: PCT/JP2005/007253
§ 371 (c)(1),
(2), (4) Date: Oct. 16, 2006

(87) PCT Pub. No.: WO2005/101471
PCT Pub. Date: Oct. 27, 2005

(65) Prior Publication Data
US 2008/0230180 A1 Sep. 25, 2008

(30) Foreign Application Priority Data
Apr. 16, 2004 (JP) .............................. 2004-122227
Jan. 28, 2005 (JP) .............................. 2005-022052

(51) Int. Cl.
C23C 16/00 (2006.01)
C23F 1/00 (2006.01)
H01L 21/306 (2006.01)
H01L 21/683 (2006.01)
B23B 31/28 (2006.01)

(52) U.S. Cl. ....................... 118/725; 118/715; 118/724; 156/345.51; 156/345.52; 156/345.53; 156/345.54; 156/345.55; 361/234; 279/128

(58) Field of Classification Search ................. 118/715, 118/725; 156/345.52, 345.53; 361/234; 279/128
See application file for complete search history.

(56) References Cited

U.S. PATENT DOCUMENTS 5,859,408 A * 1/1999 Baxendine .................. 219/390
5,996,353 A * 12/1999 Maxwell et al. ............... 62/3.2
6,250,914 B1 * 6/2001 Katsumata et al. ............. 432/5
6,299,691 B1 * 10/2001 Oda et al. ............... 118/723 R
6,329,217 B1 * 12/2001 Watanabe et al. ............. 438/48

(Continued)

FOREIGN PATENT DOCUMENTS

JP        2001 135682        5/2001

(Continued)

Primary Examiner—Parviz Hassanzadeh
Assistant Examiner—Rakesh Dhingra
(74) Attorney, Agent, or Firm—Oblon, Spivak, McClelland, Maier & Neustadt, L.L.P.

(57) ABSTRACT

Processing equipment for an object to be processed is provided with a process container, the internal of which can be evacuated, a gas introducing means for introducing a prescribed gas into the process container, a supporting table provided in the process container, a ring-shaped supporting part provided on the supporting table for supporting the object to be processed, a plurality of thermoelectric conversion elements provided on an upper plane of the supporting table on an inner side of the supporting part, an element storing space evacuating means for evacuating inside the element storing space formed by a lower plane of the object to be treated, which is supported by the supporting part, an upper plane of the supporting table and the supporting part.

14 Claims, 11 Drawing Sheets

<THE FIRST PREFERRED EMBODIMENT>

U.S. PATENT DOCUMENTS

| | | |
|---|---|---|
| 6,495,802 B1 * | 12/2002 | Maltabes et al. ............ 219/390 |
| 6,518,548 B2 * | 2/2003 | Sugaya et al. ............ 219/444.1 |
| 2003/0214031 A1 * | 11/2003 | Onoue ........................ 257/734 |
| 2004/0013419 A1 | 1/2004 | Sakuma et al. |
| 2004/0219793 A1 | 11/2004 | Hishiya et al. |

FOREIGN PATENT DOCUMENTS

| | | |
|---|---|---|
| KR | 2002-0089504 | 11/2002 |
| KR | 2003-0062366 | 7/2003 |

* cited by examiner

<THE FIFTH PREFERRED EMBODIMENT>

PROCESSING EQUIPMENT FOR OBJECT TO BE PROCESSED

FIELD OF THE INVENTION

The present invention relates to a processing equipment for performing various processes, e.g., an annealing process, a cooling process and the like, on an object to be processed, e.g., a semiconductor wafer and the like.

BACKGROUND OF THE INVENTION

In general, when manufacturing a desired semiconductor device, a semiconductor wafer is subjected to time after time various heat treatments such as a film forming process, a pattern etching process, an oxidation/diffusion process, a quality modification process, an annealing process and the like. Recently, along with a recent trend of a high density, a multilayered structure and a high integration of semiconductor devices, a strict heat treatment process has been in demand. In particular, an improvement of in-surface uniformity of a wafer and a film quality improvement are required when performing various heat treatments.

For example, when processing a channel layer of a transistor as a semiconductor device, it is typical to perform an annealing process after implanting ions of impurity atoms into the channel layer in order to stabilize the atomic structure.

In this case, if the annealing process is performed for a long period of time, the atomic structure becomes stable, but the impurity atoms are diffused into deep portions of a film thickness direction, causing a downward penetration. To this end, the annealing process needs to be performed for a shortest period of time possible. Specifically, in order to stabilize the atomic structure while preventing the impurity atoms from penetrating through the channel layer of a thin film thickness, it is necessary to rapidly increase a temperature of the semiconductor wafer to a high temperature and then rapidly decrease the temperature thereof to a low temperature at which the diffusion does not occur.

In order to achieve the aforementioned desirable annealing process, a conventional processing equipment is provided with a lamp house accommodating therein a heating lamp and a shutter mechanism for blocking radiant heat from the heating lamp. Further, such conventional processing equipment is configured to perform the annealing process at a high temperature and then rapidly decrease the temperature of the wafer by blocking the radiant heat from the heating lamp by means of an operation of the shutter mechanism.

In another conventional processing equipment disclosed in Japanese Patent Laid-open Application No. 2001-85408, peltier elements are provided on a wafer stage. The peltier elements are used for increasing and decreasing a temperature of the wafer such that an etching process can be performed on the wafer in a temperature range of about 100 to 250° C.

When the peltier elements are used for increasing and decreasing a temperature of the wafer, about a few tens of peltier elements, each being a few millimeters in length, height and width, are arranged planarly, thereby forming one element module. Such an element module is used as one unit module. Moreover, a plurality of element modules are planarly arranged corresponding to a wafer area and then fixed to a planar susceptor by screws, thereby forming a heating unit.

After the wafer is mounted on the susceptor, the wafer can be heated by applying power to the peltier elements. Further, the wafer can be cooled by applying power to the peltier elements in the opposite direction of that in the heating process.

In the prior art described above, the susceptor and the element modules are fixed to each other by being strongly pressure-contacted by means of screws in order to enhance efficiency of heat conduction by minimizing a contact thermal resistance between top surfaces of the element modules and the susceptor. Accordingly, the susceptor fixed by the screws is not allowed to be thermally expanded or contracted. As a result, a thermal expansion of the susceptor may deform the susceptor to bend or may cause a breakage of the susceptor or the peltier elements.

Moreover, in the aforementioned prior art, the susceptor is positioned on the element modules and, then, the wafer is mounted on the corresponding susceptor. In other words, a thin plate shaped member, i.e., the susceptor, is placed between the wafer and the peltier elements. The presence of the thin plate shaped member limits the enhancement and the improvement of the heat conduction efficiency.

SUMMARY OF THE INVENTION

The present invention has been developed to effectively solve the aforementioned drawbacks. It is, therefore, an object of the present invention to provide a processing equipment for an object to be processed, capable of enhancing heat conduction efficiency.

It is another object of the present invention to provide a processing equipment for an object to be processed, capable of preventing a breakage of a susceptor, when there is provided a susceptor (mounting table for mounting thereon the object to be processed), by allowing a thermal expansion and contraction of the susceptor.

The present invention provides a processing equipment for an object to be processed, including a process container having an evacuable inner space; a gas introducing unit for introducing a gas into the process container; a supporting table provided in the process container; a ring-shaped supporting part, provided on the supporting table, for supporting the object to be processed; a plurality of thermoelectric conversion elements provided on a top surface of the supporting table at an inner side of the supporting part; and an element accommodating space evacuating unit for evacuating an inside of an element accommodating space formed between a bottom surface of the object to be processed, which is supported by the supporting part, the top surface of the supporting table and the supporting part.

In accordance with the present invention, since the element accommodating space formed between the bottom surface of the object to be processed, which is supported by the ring-shaped supporting part, the top surface of the supporting table and the ring-shaped supporting part is evacuated, the object to be processed is vacuum chucked and the bottom surface of the object to be processed can thus be directly contacted with the uppermost surfaces of the thermoelectric conversion elements. Consequently, an unnecessary member is not inserted between the bottom surface of the object to be processed and the uppermost surfaces of the thermoelectric conversion elements, which leads to the improved contact between the bottom surface of the object to be processed and the uppermost surfaces of the thermoelectric conversion elements. As a result, a heat conduction resistance therebetween is greatly reduced and, accordingly, the heat conduction efficiency therebetween can be greatly improved.

Further, the space surrounding the thermoelectric conversion elements is evacuated, so that it is possible to minimize a backflow of heat moved by the thermoelectric conversion elements.

Furthermore, due to the direct contact between the bottom surface of the object to be processed and the uppermost surfaces of the thermoelectric conversion elements, the thermal response and the temperature control accuracy can be improved.

The present invention also provides a processing equipment for an object to be processed, including: a process container having an evacuable inner space; a gas introducing unit for introducing a gas into the process container; a supporting table provided in the process container; a ring-shaped supporting part provided on the supporting table; a mounting plate for mounting thereon the object to be processed supported by the supporting part; a plurality of thermoelectric conversion elements provided on a top surface of the supporting table at an inner side of the supporting part; and an element accommodating space evacuating unit for evacuating an inside of an element accommodating space formed between a bottom surface of the mounting plate, which is supported by the supporting part, the top surface of the supporting table and the supporting part.

In accordance with the present invention, since the inside of the element accommodating space formed between the bottom surface of the mounting plate supported by the ring-shaped supporting part, the top surface of the supporting table and the supporting part is evacuated, the mounting plate is vacuum chucked and, thus, the mounting plate is allowed to be thermally expanded and contracted in a plane direction thereof. Further, the bottom surface of the mounting plate is directly contacted with the uppermost surfaces of the thermoelectric conversion elements, so that a tighter contact between the bottom surface of the mounting plate and the uppermost surfaces of the thermoelectric conversion elements can be obtained. As a result, a heat conduction resistance therebetween can be greatly reduced and, accordingly, the heat conduction efficiency can be greatly improved.

Further, since the space surrounding the thermoelectric conversion elements is evacuated, it is possible to minimize the backflow of heat moved by the thermoelectric conversion elements.

Furthermore, the object to be processed can be prevented from being contaminated by components of the thermoelectric conversion elements and the like.

Preferably, the bottom surface of the mounting plate has a wiring pattern for electrically connecting the thermoelectric conversion elements.

For example, the mounting plate is supported by the supporting part via a number of pins so that the mounting plate is allowed to be thermally expanded and contracted in a horizontal direction of the mounting plate.

Moreover, preferably, the processing equipment for an object to be processed further includes a clamp mechanism for downwardly pressing a peripheral portion of the object to be processed.

Preferably, the uppermost surfaces of the thermoelectric conversion elements have a uniform height, and a mounting surface of the supporting part has a height identical to the height of the uppermost surfaces of the thermoelectric conversion elements. It is also preferable that the uppermost surfaces of the thermoelectric conversion elements have a uniform height, and a mounting surface of the supporting part has a height slightly higher than the height of the uppermost surfaces of the thermoelectric conversion elements. Alternatively, the heights of uppermost surfaces of the thermoelectric conversion elements are slightly higher in a peripheral portion of the supporting table than in a central portion thereof.

The present invention also provides a processing equipment for an object to be processed, including: a process container having an evacuable inner space; a gas introducing unit for introducing a gas into the process container; a supporting table provided in the process container; a plurality of thermoelectric conversion elements having uppermost surfaces for supporting a bottom surface of the object to be processed, the thermoelectric conversion elements being provided on a top surface of the supporting table; and a clamp mechanism for downwardly pressing a peripheral portion of the object to be processed.

In accordance with the present invention, a tighter contact can be obtained between the bottom surface of the object to be processed and the uppermost surfaces of the thermoelectric conversion elements since the clamp mechanism downwardly presses the peripheral portion of the object to be processed. Accordingly, the heat conduction resistance therebetween can be greatly reduced and, thus, the heat conduction efficiency therebetween can be greatly improved. Moreover, due to the direct contact between the bottom surface of the object to be processed and the uppermost surfaces of the thermoelectric conversion elements, the thermal response and the temperature control accuracy can be improved.

For example, the clamp mechanism has a ring-shaped clamp plate contacted with a top surface of the peripheral portion of the object to be processed.

Further, for example, the heights of the uppermost surfaces of the thermoelectric conversion elements are slightly lower in a peripheral portion of the supporting table than in a central portion thereof.

The present invention also provides a processing equipment for an object to be processed, including: a process container having an evacuable inner space; a gas introducing unit for introducing a gas into the process container; a supporting table provided in the process container; a plurality of thermoelectric conversion elements provided on a top surface of the supporting table; a mounting plate for mounting thereon the object to be processed supported by uppermost surfaces of the thermoelectric conversion elements; and a clamp mechanism for downwardly pressing a peripheral portion of the object to be processed.

In accordance with the present invention, the mounting plate is allowed to be thermally expanded and contracted in a plane direction thereof since the clamp mechanism downwardly presses the peripheral portion of the object to be processed. Therefore, a tighter contact is obtained between the bottom surface of the mounting plate and the uppermost surfaces of the thermoelectric conversion elements and, accordingly, the heat conduction resistance therebetween can be greatly reduced. As a result, the heat conduction efficiency therebetween can be greatly improved and, further, the object to be processed can be prevented from being contaminated by components of the thermoelectric conversion elements and the like.

For example, in order to restrict a vertical movement of the mounting table while allowing a horizontal thermal expansion/contraction thereof, the mounting plate may be supported by the supporting table via horizontally extending thermal expansion/contraction allowing pins.

In the above, the thermoelectric conversion elements may be provided by arranging plural element modules in a prescribed arrangement state, each element module being formed of one or more prescribed number of thermoelectric conversion elements.

Moreover, preferably, a coolant passageway where a cooling medium is made to flow is formed in the supporting table.

Moreover, generally, the processing equipment for an object to be processed further includes a heating unit for heating the object to be processed.

Furthermore, for example, uppermost surfaces of the thermoelectric conversion elements are selectively connected with each other by an upper wiring, and lowermost surfaces of the thermoelectric conversion elements are selectively connected with each other by a lower wiring. Further, a conductive material forming the upper and/or lower wirings is exposed at least either top surfaces of the upper wiring or bottom surfaces of the lower wiring. In this case, the thermal response by the thermoelectric conversion elements is improved and, accordingly, the temperature control accuracy can be improved.

For example, the top surfaces of the upper wiring are configured to be directly contacted with a bottom surface of the object to be processed. In this case, since the object to be processed is directly contacted with the top surfaces of the upper wiring, the thermal response for the thermoelectric conversion elements is improved and, thus, the temperature control accuracy can be improved.

Moreover, for example, uppermost surfaces of the thermoelectric conversion elements are selectively connected with each other by an upper wiring, and the bottom surfaces of the thermoelectric conversion elements are selectively connected with each other by a lower wiring. Further, at least either top surfaces of the upper wiring or bottom surfaces of the lower wiring is covered by an insulating film. In this case, there is no need to interpose plate-shaped insulating members, which would be otherwise required, between the upper wiring and the bottom surface of the object to be processed and/or between the lower wiring and the surface of the supporting table. As a result, the heat conductivity is improved and, thus, the thermal response can be improved.

For example, the insulating film is made of a compound of a conductive material forming the upper wiring and/or the lower wiring.

Further, for example, the bottom surfaces of the lower wiring are covered by the insulating film and directly contacted with a surface of the supporting table.

Furthermore, the insulating film is made of one of a carbide, a fluoride, a silicide, an oxide and a nitride of the conductive material, for example.

Besides, the conductive material is one of carbon, aluminum, tantalum, tungsten, Ni—Ti alloy (superelastic alloy), Fe—Cr—Ni—Mo dual phase stainless steel (superplastic material) and silicon, for example.

In addition, the upper wiring and the lower wiring are formed in a plate shape, for example.

DETAILED DESCRIPTION OF THE PREFERRED EMBODIMENTS

Hereinafter, embodiments of a processing equipment for an object to be processed in accordance with the present invention will be described with reference to the accompanying drawings.

Figure 1:
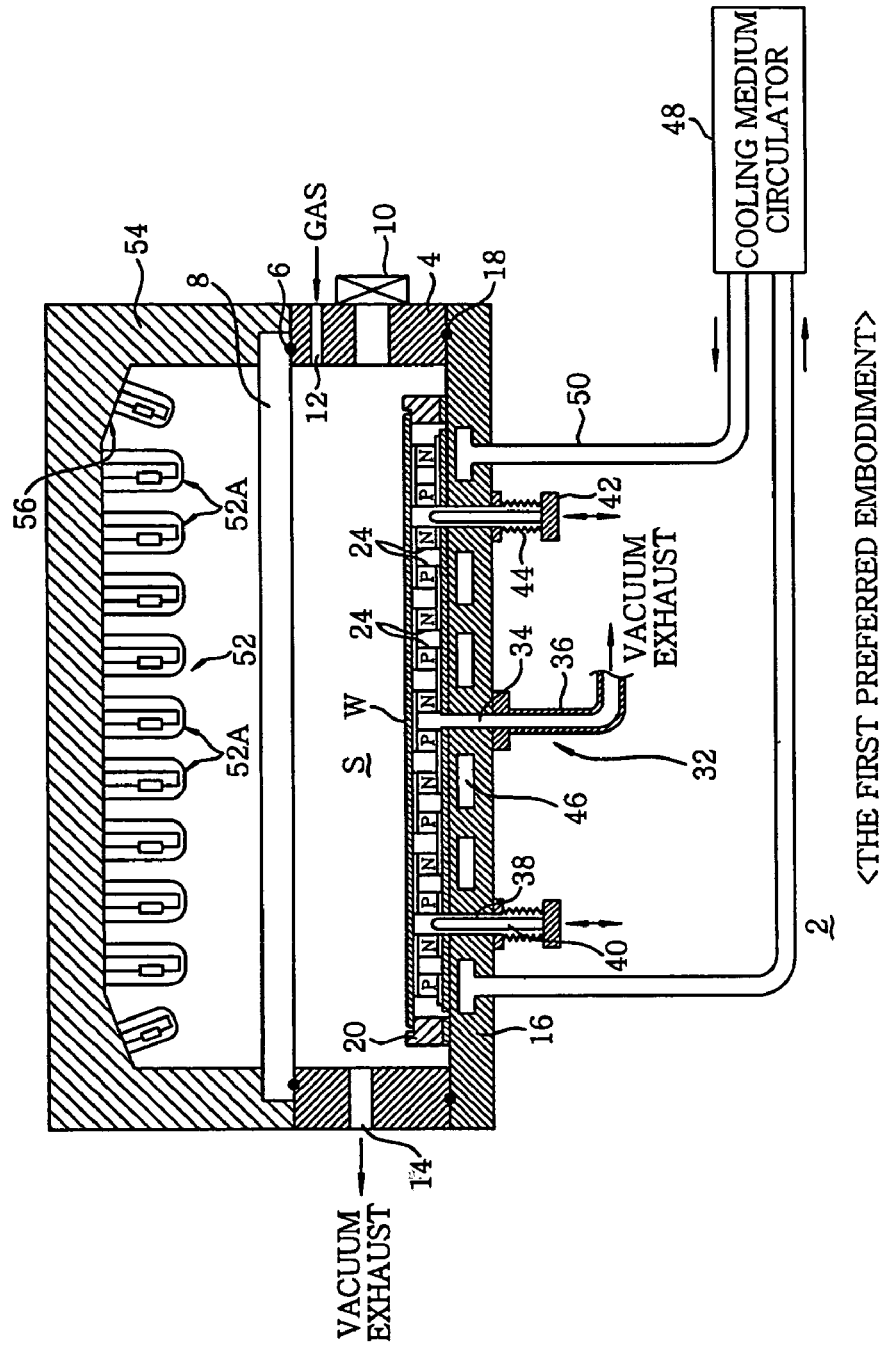
FIG. 1 is a schematic cross sectional view of a processing equipment for an object to be processed in accordance with a first embodiment of the present invention.

FIG. 1 shows a schematic cross sectional view of a processing equipment for an object to be processed in accordance with a first embodiment of the present invention.

Figure 2A:
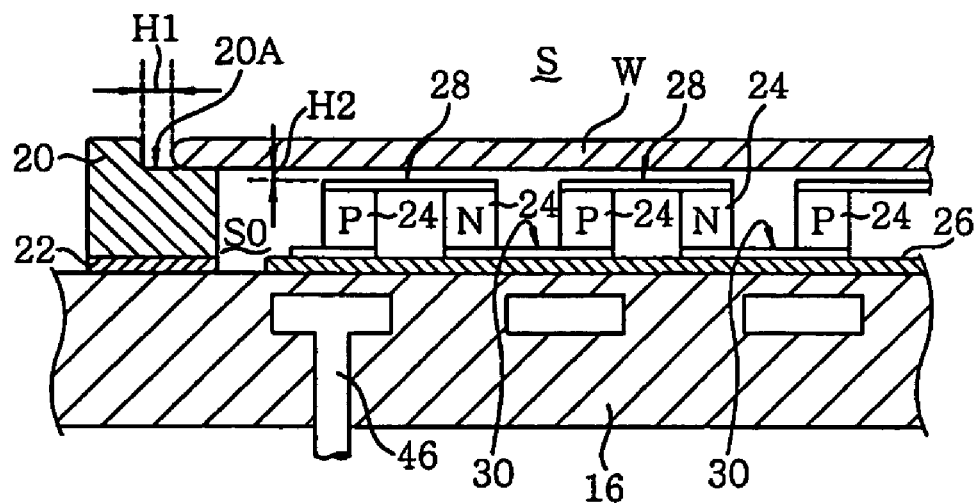
FIGS. 2A and 2B illustrate fragmentary enlarged cross sectional views showing a region around a peripheral portion of a supporting table of FIG. 1.
Figure 2B:
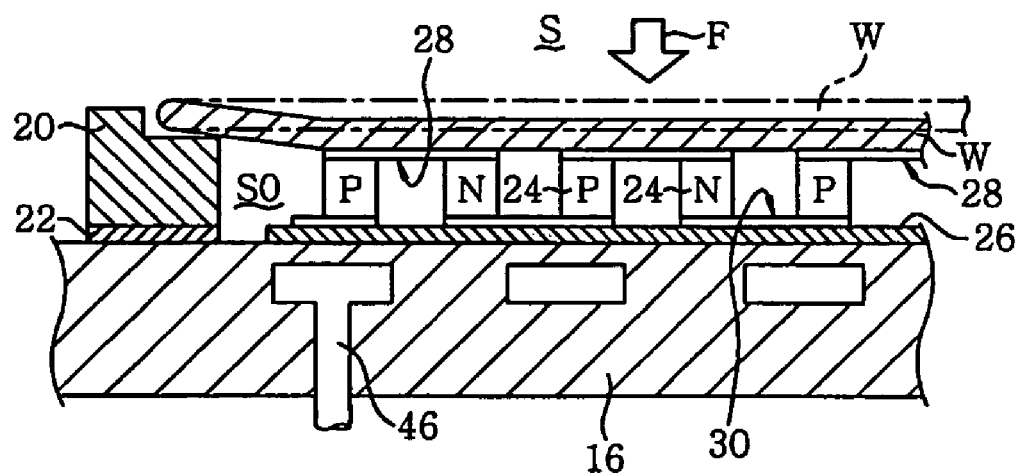
Figure 3:
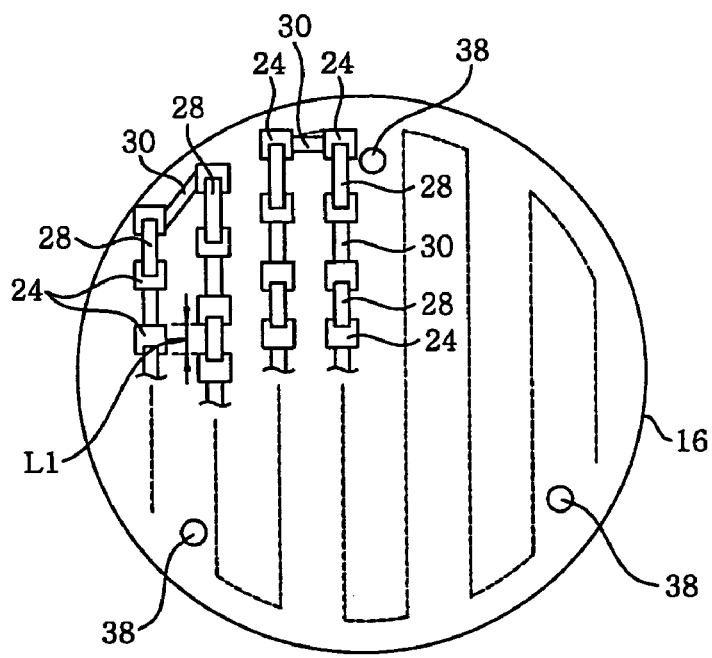
FIG. 3 describes a plan view depicting an arrangement of thermoelectric conversion elements.

FIGS. 2A and 2B illustrate fragmentary enlarged cross sectional views depicting a region around a peripheral portion of a supporting table of FIG. 1. FIG. 3 describes a plan view showing an arrangement of thermoelectric conversion elements.

As shown in FIG. 1, a processing equipment 2 in accordance with this embodiment has a cylindrical process container 4 formed in a cylindrical shape with aluminum, for example. The process container 4 has an opened ceiling portion. The ceiling portion (opening portion) is configured to be sealed by a transparent transmission window 8 via a sealing member 6 such as an O-ring or the like.

Provided on a sidewall of the process container 4 is a gate valve 10 to be opened and closed for loading and unloading a semiconductor wafer W as an object to be processed. Further, provided on the sidewall of the process container 4 is a gas nozzle 12 serving as a gas introducing unit for introducing a gas for use in processing the semiconductor wafer W into the process container 4.

An exhaust port 14 is formed on another side of the sidewall of the process container 4 and connected with an exhaust system having a vacuum pump (not shown). Accordingly, the atmosphere inside the process container 4 can be evacuated, for example.

A supporting table 16 is provided at a bottom portion of the process container 4. That is, the thick supporting table 16 made of, e.g., aluminum, is airtightly and fixedly attached to an opened lower end of the process container 4 via a sealing member 18 such as an O-ring or the like.

Provided on the supporting table 16 is a supporting part 20 that is upwardly protruded to support a peripheral portion of the semiconductor wafer W. Specifically, as shown in FIGS. 2A and 2B, the supporting part 20 is formed in a ring-shape and provided at a peripheral portion of the supporting table 16 via a plate-shaped heat insulating member 22 made of quartz or the like, for example.

The supporting part 20 is made of aluminum, quartz or the like. The supporting part 20 is positioned so as to be approximately concentric with a mounting position of the wafer W. A stepped mounting surface 20A (see FIG. 2A) is formed on an upper inner peripheral side of the ring-shaped supporting part 20. The wafer W can be mounted on the supporting part 20 to allow a bottom surface of the peripheral portion of the semiconductor wafer W to be contacted with the mounting surface 20A.

A distance H1 (see FIG. 2A) between a side surface of a stepped portion forming the mounting surface 20A and an outer peripheral end of the wafer W mounted on a proper position is preferably set to be about 1 mm, for example, so that the stepped portion can determine the position of the wafer W. In this case, if the wafer having a diameter of 300 mm is heated to 1000° C. for example, a diameter thereof expands by about 2 mm. At such a temperature, the wafer of 300 mm is received on the mounting surface 20A almost without a gap. In any case, the distance H1 can be properly set depending on a wafer size and a desired temperature.

An inner area surrounded by the supporting part 20 of the supporting table 16 serves as an element accommodating space S0. Such an element accommodating space S0 accommodates therein a plurality of peltier elements 24 serving as a plurality of thermoelectric conversion elements that are features of the present invention. To be specific, a thin plate-shaped insulating member 26 made of ceramic such as AlN, $Al_2O_3$ or the like is formed on an entire top surface of the inner side of the supporting part 20 of the supporting table 16. The multiple upright peltier elements 24 are arranged in order on the insulating member 26.

Herein, each of the peltier elements 24 is formed of a separate body (separate module). The peltier elements 24 are formed of P-type semiconductors and N-type semiconductors. The P-type semiconductors and the N-type semiconductors are arranged alternately. Further upper and lower electrodes of the neighboring P-type semiconductors and the N-type semiconductors are alternately connected by an upper wiring 28 and a lower wiring 30, respectively, as shown in FIGS. 2A and 2B. Accordingly, the P-type semiconductors and the N-type semiconductors forming the peltier elements 24 are connected in series as shown in FIG. 3. That is, electricity is made to flow P-type→N-type→P-type→N-type→P-type→N-type . . . , for example.

The upper and the lower wiring 28 and 30 are made of a copper plate or a super elastic carbon fiber plate, for example. Further, the wirings 28 and 30 are fixedly joined by, e.g., a welding, a brazing, a soldering or the like, depending on a heat treatment temperature.

The upper and the lower wiring 28 and 30 may be formed in a thin plate shape having a thickness of about 0.1 to 2 mm. In addition, the upper and the lower wiring 28 and 30 may have surfaces in which a conductive material, e.g., carbon, forming the wirings is exposed or surfaces which is covered by an insulating film made of the compound of the conductive material.

Referring to FIG. 3, the peltier elements 24 are connected in series in a zigzag shape over an approximately entire top surface of the supporting table 16. However, the connection type of the peltier elements 24 is not limited thereto. For example, the peltier elements 24 may be connected in series in each of multiple divided areas, e.g., multiple concentric areas, on the top surface of the supporting table 16. In this case, each of the areas can be separately controlled.

Each of the peltier elements 24 has a cubical shape of, e.g., 3 mm×3 mm×3 mm in length, height and width. Further, a gap L1 between the peltier elements 24 (see FIG. 3) is set to be about 1 mm, for example. Accordingly, uppermost surfaces of the peltier elements 24 are made to be approximately uniformly adjacent to an entire back surface of the wafer W. Referring to FIG. 3, the distance L1 between the peltier elements 24 is drawn wider than the actual distance in order to help the understanding of the present invention.

The peltier elements 24 are connected with an external peltier controller (not shown) via lead lines (not shown). The peltier controller is configured to control a direction and a level of current applied to the peltier elements 24. A thermoelectric conversion indicates a conversion from thermal energy to electrical energy and vice versa.

As for the peltier elements 24, there can be used, e.g., $Bi_2Te_3$ (bismuth telluride) elements, PbTe (lead telluride) elements, SiGe (silicon germanium) elements or the like that are endurable against a high temperature above 400° C. Herein, in order to deal with a wafer having a diameter of 300 mm, about hundred peltier elements 24 are used, for example. In order to deal with a wafer having a diameter of 200 mm, about fifty peltier elements 24 are used, for example.

A mounting surface 20A of the supporting part 20 is formed at a position equal to or slightly higher than the uppermost surfaces of the peltier elements 24 (uppermost surface of the upper wiring 28, to be exact). To be specific, a distance H2 (see FIG. 2A) between the mounting surface 20A and the uppermost surface of the upper wiring 28 is set to be about 0 to 0.1 mm.

The supporting table 16 is provided with an element accommodating space evacuating unit 32 for evacuating the inside of the element accommodating space S0 formed between a bottom surface of the wafer W, a top surface of the supporting table 16 and the supporting part 20. Specifically, the supporting table 16 is provided with a gas exhaust port 34 communicating with the element accommodating space S0. Also, the gas exhaust port 34 is connected with a gas exhaust system 36 where an vacuum pump (not shown) is installed, so that the inside of the element accommodating space S0 can be evacuated when necessary. Accordingly, the wafer W is bent downwardly and thus vacuum-chucked, as shown in FIG. 2B.

Further, formed in the supporting table 16 is a plurality of (three in FIG. 3) pin holes 38 spaced apart from each other at predetermined intervals along a circumferential direction of the supporting table 16. A lift pin 40 is inserted in each of the pin holes 38 to pass therethrough. A lower portion of each lift pin 40 is supported by, e.g., a ring-shaped elevating plate 42 connected thereto. The elevating plate 42 moves up and down by an actuator (not shown). Accordingly, the lift pins 40 are protruded upwardly above the uppermost surfaces of the peltier elements 24, thereby raising or lowering the wafer W.

An expansible and contractible metal bellows 44 of a pleated box shape is provided at a through hole portion of the supporting table 16 for each lift pin 40. Consequently, the lift pins 40 can move vertically while maintaining a vacuum state of the inner space of the process container 4.

Further, the supporting plate 16 is provided with a cooling passageway 46 where a cooling medium is made to flow therethrough. The cooling passageway 46 is connected with a cooling medium circulator 48 via a flow path 50. When the cooling medium is made to flow along the cooling passageway 46 by controlling the cooling medium circulator 48 when necessary, it is possible to cool bottom sides of the peltier elements 24 via the supporting table 16.

A heating unit 52 for heating the wafer W is provided above the transmitting window 8. To be specific, the heating unit 52 of this embodiment has a plurality of heating lamps 52A. These heating lamps 52A are attached to a substantially entire inner surface of a ceiling portion of a container-shaped lamp house 54 provided above the transmitting window 8. Herein, the inner surface of the ceiling portion of the lamp house 54 is formed as a reflection mirror 56, so that heat rays from each of the heating lamps 52A are reflected downwardly.

The following is a description of an operation of the processing equipment 2 configured as described above. Herein, an annealing process is performed on the semiconductor wafer W.

First of all, an unprocessed semiconductor wafer W is introduced into the process container 4 via the opened gate valve 10. A bottom surface of a peripheral portion of the semiconductor wafer W is supported on the mounting surface 20A of the supporting part 20 (see FIG. 2A). Next, an inner space of the process container 4 is sealed.

Then, a processing gas, e.g., $N_2$ gas or Ar gas, is introduced into the process container 4 via the gas nozzle 12 at a controlled flow rate. At the same time, a processing space S in the process container 4 is evacuated and maintained at a predetermined process pressure, e.g., 1 to 100 Pa (7.5 mTorr to 750 mTorr). Also, the element accommodating space evacuating unit 32 is driven, to evacuate the inside of the element accommodating space S0 under the bottom surface of the wafer W. Next, each of the heating lamps 52A is turned on, and current flows in each of the peltier elements 24, as will be described later.

The heat rays generated from each of the heating lamps 52A are incident on a surface of the semiconductor wafer W after transmitting the transmitting window 8, so that the semiconductor wafer W is rapidly heated. Further, by flowing the current in the peltier elements 24 to make the uppermost surfaces of the peltier elements 24 generate heat, the wafer W is also heated by the peltier elements 24. Hence, the wafer W is very rapidly heated.

In the aforementioned first embodiment, the inside of the element accommodating space S0 is evacuated and, thus, a pressure therein becomes lower than that in the processing space S disposed above the top surface of the wafer W. Due to the pressure difference, a downward pressing force F is applied to the wafer as shown in FIG. 2B, thereby slightly deforming the wafer W downwardly. Consequently, the bottom surface of the wafer W becomes approximately uniformly in tight contact with the uppermost surfaces of the peltier elements 24 in an in-surface direction. Therefore, the thermal resistance between the bottom surface of the wafer and the peltier elements 24 is greatly reduced. Further, the heat conduction efficiency is remarkably improved. As a result, a temperature of the wafer W can be effectively increased. A heating rate involved here is about 1 to 400° C./sec.

Further, since the bottom surface of the wafer W is directly contacted with the uppermost surfaces of the peltier elements 24 as described above, the thermal response is remarkably improved. Accordingly, the accuracy of the heating rate can be improved by controlling the current flowing in the peltier elements 24, for example. Also, the heating rate can be adjusted by changing the contact heat resistance between the wafer W and each peltier element 24 with the pressing force F controlled by adjusting the pressure difference between the processing space S and the element accommodating space S0.

During the annealing process, the cooling medium circulator 48 is not driven; thus, the cooling medium does not flow in the cooling passageway 46 of the supporting table 16.

With the evacuation of the inside of the element accommodating space S0, a vertical movement of heat in the peltier elements 24 due to a gas convection is prevented. This also improves the heating efficiency of the peltier elements 24.

If the annealing process is completed in a state where the wafer W is heated, in order to rapidly cool the wafer W, each of the heating lamps 52A is turned off and, also, a direction of the current flowing in the peltier elements 24 is inverted. That is, the current flows in a direction of cooling the uppermost surfaces of the peltier elements 42. Accordingly, the uppermost surfaces of the peltier elements 24 are forcibly cooled. Due to such a forcible cooling as well as cooling effects by convection in the processing space S and heat radiation from the process container 4, the wafer W contacted with the peltier elements 24 is forcibly cooled. Consequently, the temperature of the wafer W can be rapidly decreased.

In this case, the heat is generated from the lowermost surfaces of the peltier elements 24, so that the cooling medium flows in the cooling passageway 46 formed in the supporting table 16. Consequently, the heat generated from the lowermost surfaces of the peltier elements 24 can be discharged to the outside by the cooling medium. Cooling water or the like can be used as the cooling medium.

During the cooling process, the element accommodating space evacuating unit 32 is continually driven. Accordingly, the bottom surface of the wafer W and the uppermost surfaces of the peltier elements 24 are directly contacted with each other over the approximately entire bottom surface of the wafer W, as shown in FIG. 2B. Accordingly, the contact heat resistance between the bottom surface of the wafer W and the uppermost surfaces of the peltier elements 24 is very small and, thus, the wafer W can be cooled effectively. Also, the cooling rate can be adjusted by changing the contact heat resistance between the wafer W and the peltier elements 24 by way of adjusting the pressure difference between the processing space S and the element accommodating space S0.

As described above, since the uppermost surfaces of the peltier elements 24 (specifically, top surface of the upper wiring 28) are directly contacted with the bottom surface of the wafer W as an object to be processed, the heat resistance of the corresponding portion (contact surfaces) is reduced and, accordingly, the thermal response is improved. Consequently, the temperature of the wafer W can be effectively and rapidly increased and decreased.

An insulating oxide film is normally formed on the bottom surface (back surface) of the wafer W. Therefore, even when the corresponding portion is contacted with the upper wiring 28 having surfaces in which a conductive material is exposed, the peltier elements 24 are not short-circuited. When an insulating film is formed on the surfaces of the upper wiring 28, the problem of the short circuit does not occur regardless of a state of the bottom surface of the wafer.

Herein, simulations were performed to obtain cooling rates in the processing equipment of the first embodiment and the conventional processing equipment using a mounting plate made of aluminum as a susceptor for mounting thereon a wafer. Hereinafter, the results thereof will be explained.

Figure 4:
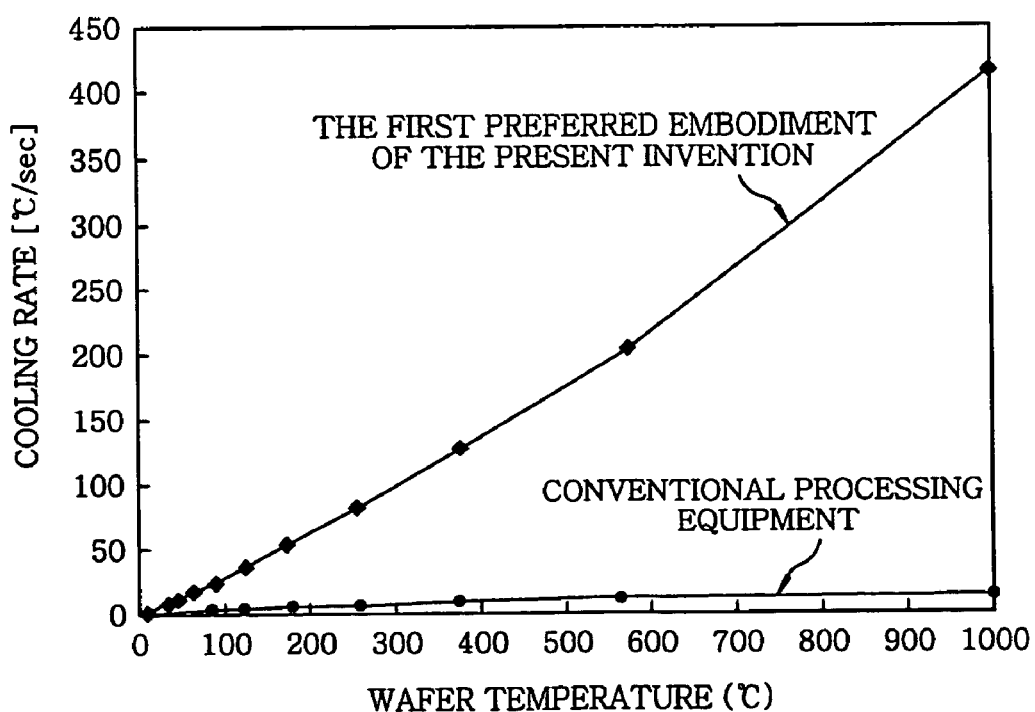
FIG. 4 provides a graph showing results of simulations of cooling rates in the processing equipment in accordance with the first embodiment of the present invention and a conventional processing equipment.

FIG. 4 provides a graph showing results of the simulations of the cooling rates in the processing equipment in accordance with the first embodiment of the present invention and the conventional processing equipment. In the drawing, there are illustrated the cooling rates, obtained by increasing the temperature of the wafer W to 1000° C. and then decreasing the temperature thereof from the corresponding temperature (1000° C.).

As clearly can be seen from FIG. 4, the conventional processing equipment has a very low cooling rate of 10 to 20° C./sec, regardless of the wafer temperature due to a great heat capacity of the mounting plate made of aluminum. On the other hand, the first embodiment of the present invention has a high cooling rate of 100 to several hundred ° C./sec, due to a very small heat capacity of the inner portion of the processing equipment. That is, the temperature of the wafer W can be effectively and rapidly decreased in the first embodiment of the present invention.

Figure 5:
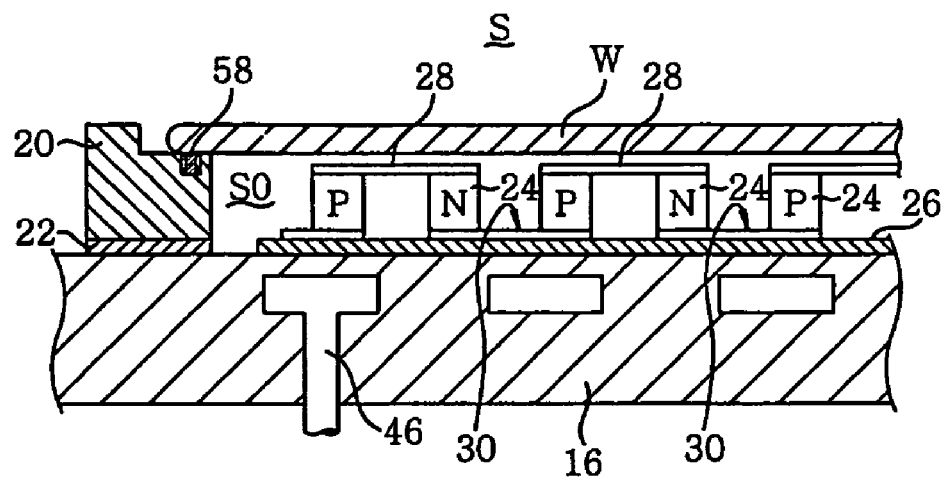
FIG. 5 presents a fragmentary enlarged view of a modified example of the first embodiment of the present invention.

In the examples shown in FIGS. 2A and 2B, nothing is formed on the mounting table 20A of the supporting part 20. However, as shown in FIG. 5, a seal member 58 such as an O-ring or the like may be provided on the ring-shaped mounting surface 20A. In this case, when the inside of the element accommodating space S0 is evacuated, a space between the bottom surface of the peripheral portion of the wafer W and the mounting surface 20A is sealed to some extent. Accordingly, the pressing force F pressing the wafer W downwardly increases, which leads to the tighter contact between the bottom surface of the wafer W and the uppermost surfaces of the peltier elements 24. Consequently, the heat resistance between the bottom surface of the wafer W and the uppermost surfaces of the peltier elements 24 is further reduced, thereby further improving the thermal efficiency.

Figure 6:
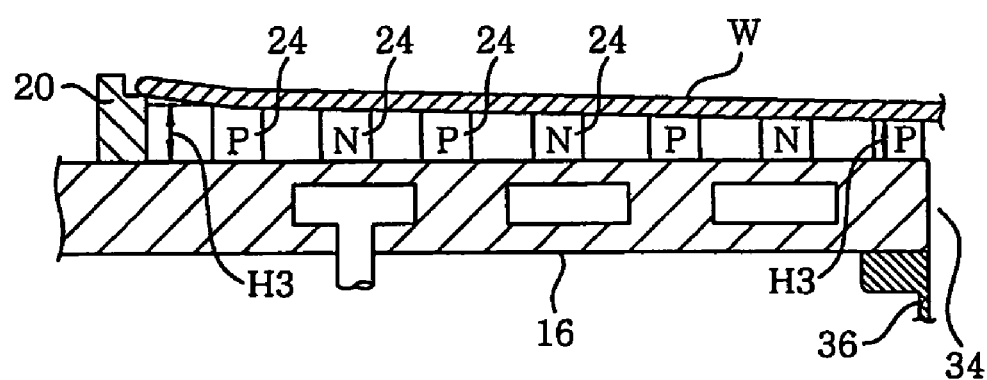
FIG. 6 represents a fragmentary enlarged view schematically showing an example of changing heights of peltier elements.

Although the peltier elements 24 have a uniform height in the example illustrated in FIG. 1, the present invention is not limited thereto. An example shown in FIG. 6 can be employed, for instance. FIG. 6 represents a fragmentary enlarged view schematically showing an example of changing heights of the peltier elements. In the example depicted in FIG. 6, heights H3 of the peltier elements 24 are slightly higher in a peripheral portion of the supporting table 16 than in a central portion thereof. To be specific, the heights H3 of the peltier elements 24 become gradually higher from the central portion of the supporting table 16 toward the peripheral portion thereof. Herein, positions of the uppermost surfaces of the peltier elements 24 are set to mimic a curved surface formed when the wafer W is deformed to be curved downwardly in a protruded shape while the peripheral portion of the wafer W is supported by the supporting part 20. In this case, a further tighter contact between the bottom surface of the wafer W and the uppermost surfaces of the peltier elements 24 can be obtained and, accordingly, the thermal efficiency can be further improved.

Hereinafter, a second embodiment of the present invention will be described. In the first embodiment of FIG. 1, the element accommodating space evacuating unit 32 is provided as a means for making a close contact between the bottom surface of the wafer W and the uppermost surfaces of the peltier elements 24. In this embodiment, however, a conventionally known clamp mechanism is used instead of the element accommodating space evacuating unit 32.

Figure 7:
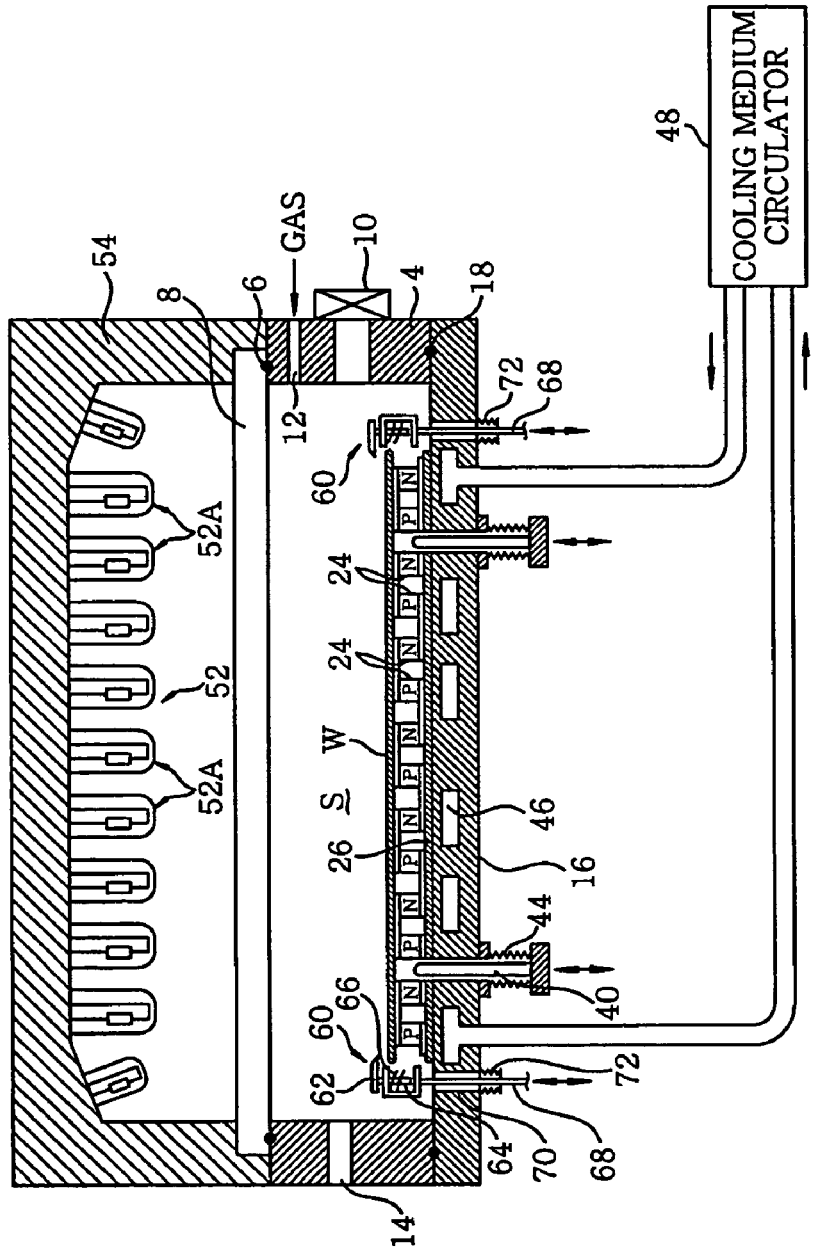
FIG. 7 shows a schematic cross sectional view of a processing equipment for an object to be processed in accordance with a second embodiment of the present invention.

FIG. 7 shows a schematic cross sectional view of a processing equipment for an object to be processed in accordance with the second embodiment of the present invention. In FIG. 7, like parts as those of the first embodiment of FIG. 1 will be designated by like reference characters, and descriptions thereon will be omitted.

As illustrated in FIG. 7, the processing equipment of this embodiment is not provided with the element accommodating space evacuating unit 32. Instead, there is provided a clamp mechanism 60 for downwardly pressing the peripheral portion of the wafer W. Further, this embodiment may be provided with the supporting part 20 as shown in FIG. 1, or may not be provided therewith as described in FIG. 7. When the supporting part 20 is not provided, the wafer W is directly mounted on the uppermost surfaces of the peltier elements 24.

Specifically, the clamp mechanism 60 includes a ring-shaped clamp plate 62 made of ceramic such as AlN or the like.

The clamp plate 62 is supported by a plurality of support rods 64. Each of the support rods 64 is connected with an elevation rod 68 via a spring 66. The elevation rod 68 is extended downwardly through a rod hole 70 formed in the supporting table 16 and is moved up and down by an actuator that is not shown. Moreover, the rod hole 70 is provided with a bellows 72 for allowing a vertical movement of the elevation rod 68 while maintaining an airtightness of an inner space of the process container 4.

In this embodiment, a bottom surface of an inner peripheral portion of the ring-shaped clamp plate 62 presses a top surface of the peripheral portion of the wafer W by using an elastic force of the springs 66 during the annealing process (heating process) and the cooling process. Accordingly, the bottom surface of the wafer W becomes in tight contact with the uppermost surfaces of the peltier elements 24, so that operation effects same as those of the first embodiment can be obtained. That is, the heat conduction efficiency between the bottom surface of the wafer W and the uppermost surfaces of the peltier elements 24 can be improved by reducing the contact heat resistance between the bottom surface of the wafer W and the uppermost surfaces of the peltier elements 24. Further, the thermal response can also be enhanced due to the absence of an additional member between the bottom surface of the wafer W and the uppermost surfaces of the peltier elements 24.

Moreover, since the peripheral portion of the wafer W is pressed downwardly in this embodiment, the central portion of the wafer W may be deformed to be curved as if it is slightly inflated upwardly in a protruded shape. Consequently, contrary to the case shown in FIG. 6, the heights H3 of the peltier elements 24 are preferably set to be slightly lower in a peripheral portion of the supporting table 16 than in a central portion thereof. In other words, the heights H3 of the peltier elements 24 are preferably set to be higher in the central portion side of the wafer and gradually lower toward a peripheral portion thereof in a curved shape. In this case, a further tighter contact between the bottom surface of the wafer W and the uppermost surfaces of the peltier elements 24 can be obtained and, thus, the heat conduction efficiency can also be further improved.

Hereinafter, a third embodiment of the present invention will be described.

In the first and the second embodiment, the bottom surface of the wafer W is directly contacted with the uppermost surfaces of the peltier elements 24. Accordingly, the wafer W itself may be contaminated by metal components forming the peltier elements 24, such as germanium, bismuth, tellurium, lead and the like.

Figure 8:
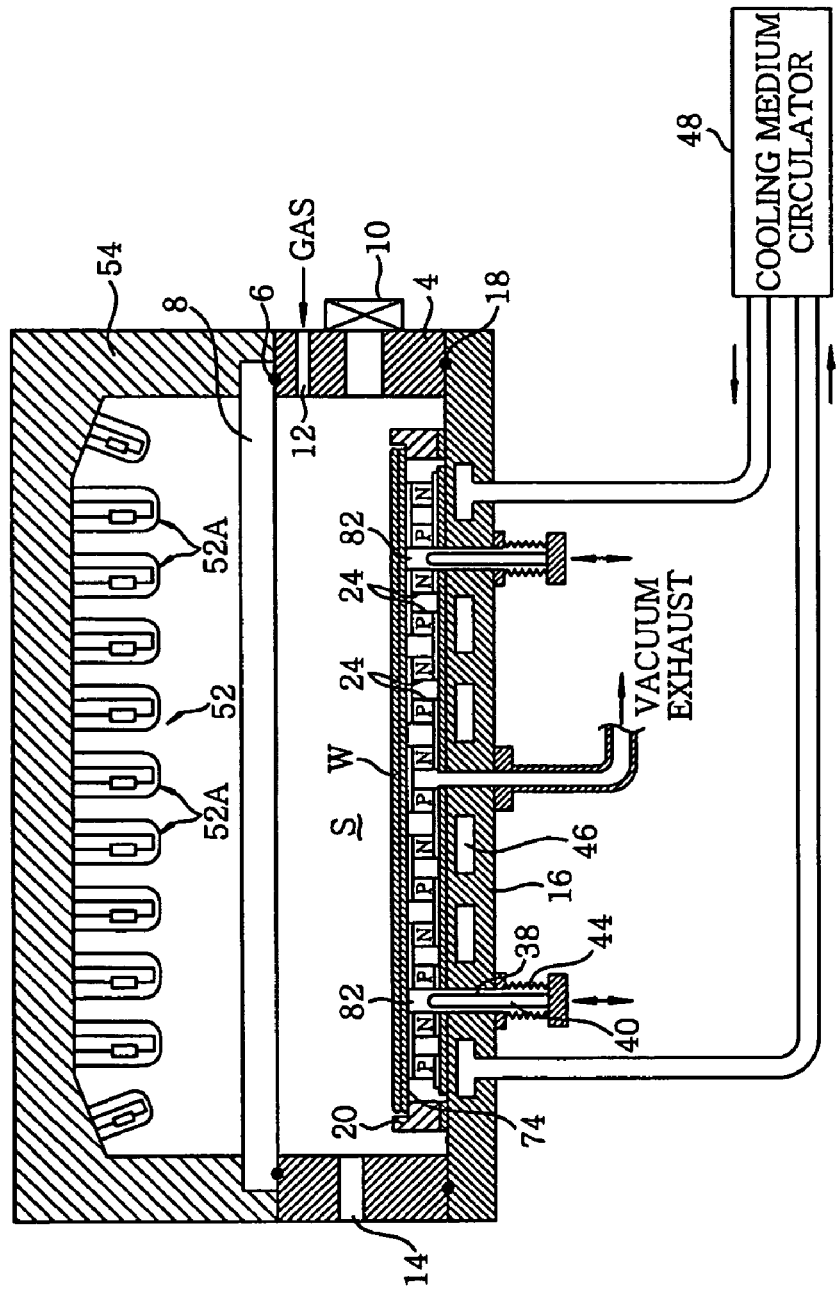
FIG. 8 depicts a schematic cross sectional view of a processing equipment for an object to be processed in accordance with a third embodiment of the present invention.
Figure 9:
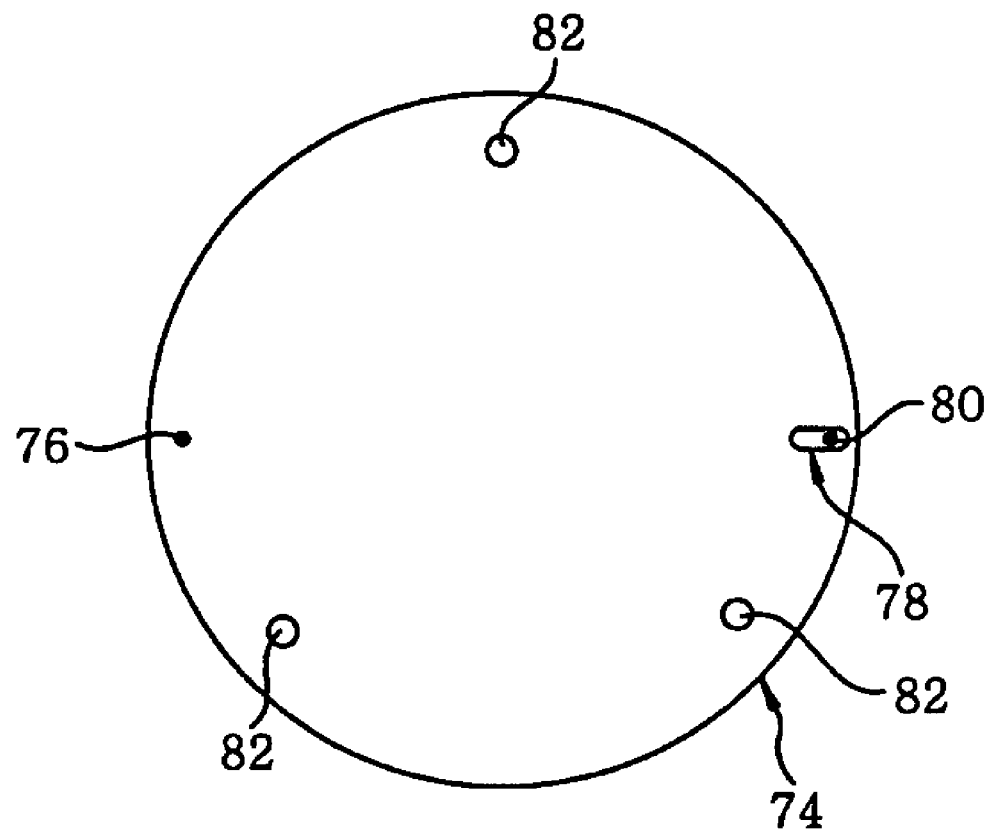
FIG. 9 provides a plan view of a mounting plate in accordance with the third embodiment of the present invention.

The third embodiment of the present invention has a purpose of preventing a metal contamination of the wafer W. FIG. 8 depicts a schematic cross sectional view of a third embodiment of the present invention. FIG. 9 provides a plan view of a mounting plate in accordance with the third embodiment of the present invention. In FIGS. 8 and 9, like parts as those of the first embodiment of FIG. 1 will be designated by like reference characters, and descriptions thereof will be omitted.

In the first embodiment, the wafer W is directly supported by the supporting part 20. However, in this embodiment, a circular plate shaped mounting plate 74 having a diameter approximately equal to that of the wafer W is supported by the supporting part 20 and, further, the wafer W is mounted on the mounting plate 74, as shown in FIG. 8.

A thickness of the mounting plate 74 is about 0.1 to 5 mm. Therefore, the mounting plate 74 may be deformed by the pressure difference between the processing space S and the element accommodating space S0. As for the mounting plate 74, there can be used a material having a great electrical resistance and a small thermal resistance, such as SiC, SiN, AlN, sapphire or the like. Moreover, formed in the mounting plate 74 are pin holes 82 where the lift pins 40 pass through.

A height of the stepped portion of the supporting part 20 in this embodiment is preferably set to be higher than that in the first embodiment by a thickness of the mounting plate 74, to thereby prevent a separation of the wafer W, such as a sideward sliding or the like.

Due to the insertion of the mounting plate 74, this embodiment has a low heat efficiency and a low heat conduction efficiency between the bottom surface of the wafer W and the uppermost surfaces of the peltier elements 24, compared with those of the first and the second embodiment. However, the heat efficiency and the heat conduction efficiency of this embodiment may be considered high compared to those of the conventional equipment.

Further, due to the presence of the mounting plate 74, even when the metal components or the like forming the peltier elements 24 are scattered upward, the corresponding metal components and the like are trapped by the mounting plate 74 and, thus, a metal contamination of the wafer W can be prevented. Besides, due to the vacuum-chucking of the mounting plate 74, the bottom surface of the mounting plate 74 can be closely contacted to the uppermost surfaces of the peltier elements 24.

Although the mounting plate 74 itself is thermally expandable and contractible by the temperature increase and decrease of the wafer W, the mounting plate 74 is fixed by the vacuum chucking. That is, its expansion and contraction of a plane direction is not restricted. Therefore, it is possible to prevent a breakage or the like of the mounting plate 74.

Although the upper wiring 28 (see FIG. 2A) of the peltier elements 24 in the first and the second embodiment is bonded to upper electrodes of the peltier elements 24 by a welding or the like, the upper wiring 28 in this embodiment may be provided as a wiring pattern on the bottom surface of the mounting plate 74. The wiring pattern may be formed of W (tungsten), TiN, MO, Ti or Ta that is endurable against a high temperature. Further, such a wiring pattern may be formed on the bottom surface of the mounting plate 74 by a plating, a thermal spraying, an ion implanter, a CVD, a PVD or the like.

When the wiring pattern serving as the upper wiring 28, is formed on the bottom surface of the mounting plate 74 as described above, a misalignment of the mounting plate 74 should be prevented in order to avoid a misalignment between the corresponding wiring pattern and the upper electrodes of the peltier elements 24. However, the thermal expansion and contraction of the mounting plate 74 should be allowed.

Therefore, a part of the peripheral portion of the mounting plate 74 is fixed by a pin 76 as shown in FIG. 9. Moreover, a portion positioned at an opposite side of the pin 76 in a diametric direction of the mounting plate 74 is fixed by a pin 80 via an elongated hole 78. A length direction of the elongated hole 78 is directed toward the pin 76. Such a configuration prevents the misalignment of the mounting plate 74 while allowing the horizontal thermal expansion and contraction of the mounting plate 74. As a result, the wiring pattern (upper wiring) can be properly contacted to the upper electrodes of the peltier elements 24 electrically. Also, it is possible to avoid a deformation of the wafer and/or the mounting plate due to a rapid temperature increase and decrease, a jump-up of the wafer W due to the deformation, and the like.

The configuration having the pins 76 and 80 described in FIG. 9 may also be employed in the case where the wiring pattern is not provided on the bottom surface of the mounting plate 74. In this case, the jump-up of the wafer W and the like can also be effectively prevented.

Hereinafter, a fourth embodiment of the present invention will be described. This embodiment has a configuration obtained by combining the second embodiment and the third embodiment.

Figure 10:
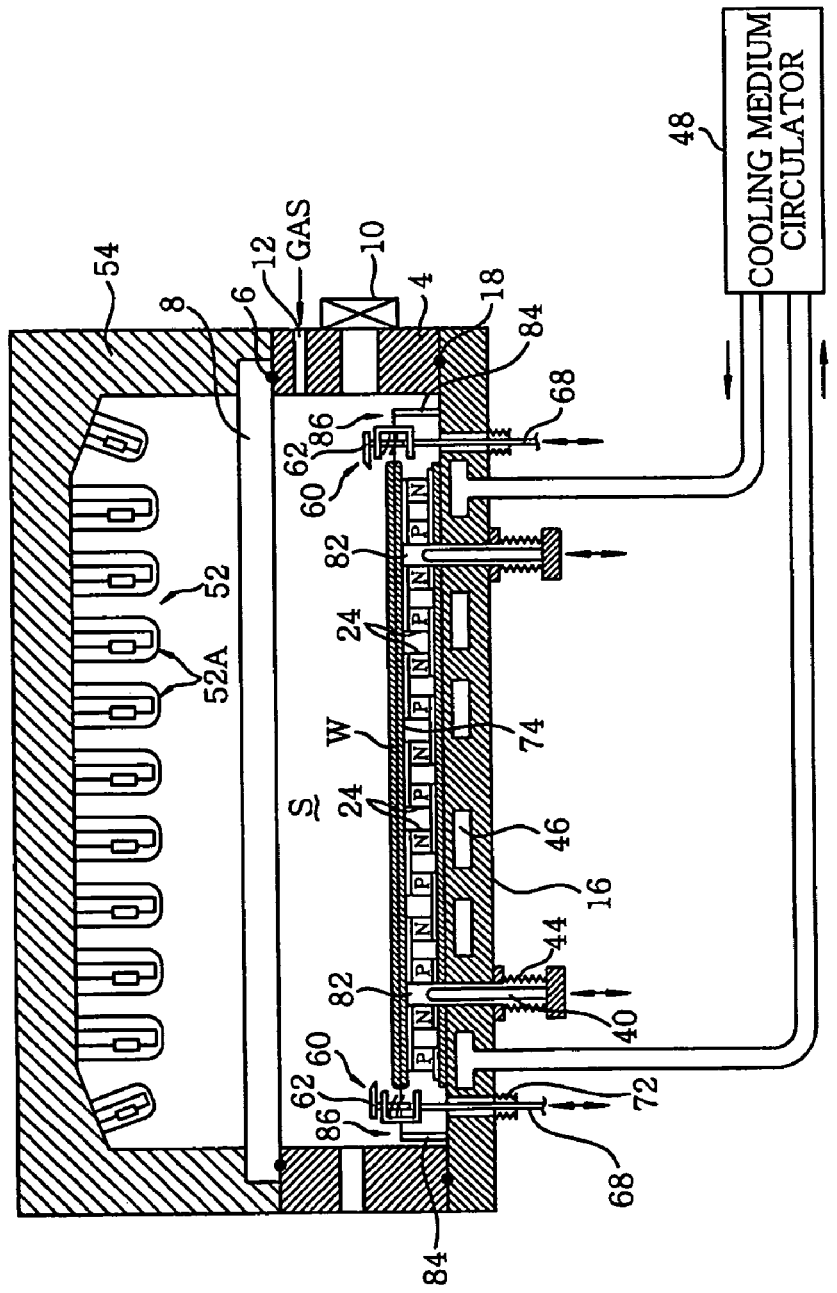
FIG. 10 is a schematic cross sectional view of a processing equipment for an object to be processed in accordance with a fourth embodiment of the present invention.
Figure 11:
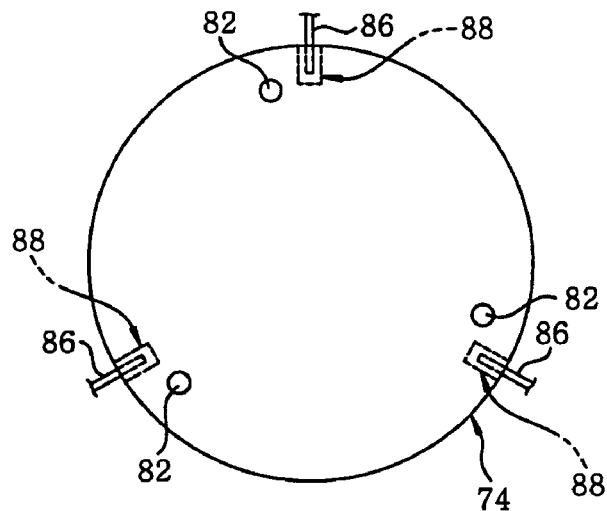
FIG. 11 illustrates a plan view of a mounting plate in accordance with the fourth embodiment of the present invention.

FIG. 10 is a schematic cross sectional view of a fourth embodiment of the present invention. FIG. 11 illustrates a plan view of a mounting plate of FIG. 10. In FIGS. 10 and 11, like parts as those of the embodiments of FIGS. 1, 7 and 8 will be designated by like reference characters, and descriptions thereof will be omitted.

As illustrated in FIG. 10, this embodiment presses the peripheral portion of the wafer W by using the clamp mechanism 60 (see FIG. 7) without using the element accommodating space evacuating unit 32 of the first embodiment. Further, in this embodiment, the wafer W is mounted on the top surface of the mounting plate 74 (see FIG. 8) used in the third embodiment.

Further, this embodiment has guide pins 86 horizontally provided from support columns 84 raised on the peripheral portion of the supporting table 16 toward a central portion of the mounting plate 74 (see FIG. 11), to thereby position the wafer W and prevent the jump-up of the wafer. The guide pins 86 are provided at three places spaced apart from each other with substantially same intervals along a circumferential direction of the mounting plate 74. Leading end portions of the guide pins 86 are inserted, in a loosely fitted manner, into guide holes 88 formed on a sidewall of the mounting plate 74. Accordingly, it is possible to prevent the jump-up of the mounting plate 74 while allowing the horizontal thermal expansion and contraction of the mounting plate 74 itself. Moreover, the wiring pattern may be formed on the bottom surface of the mounting plate 74 as in the third embodiment.

In accordance with this embodiment, it is possible to obtain the operation effects same as those of the second and the third embodiment.

Figure 12:
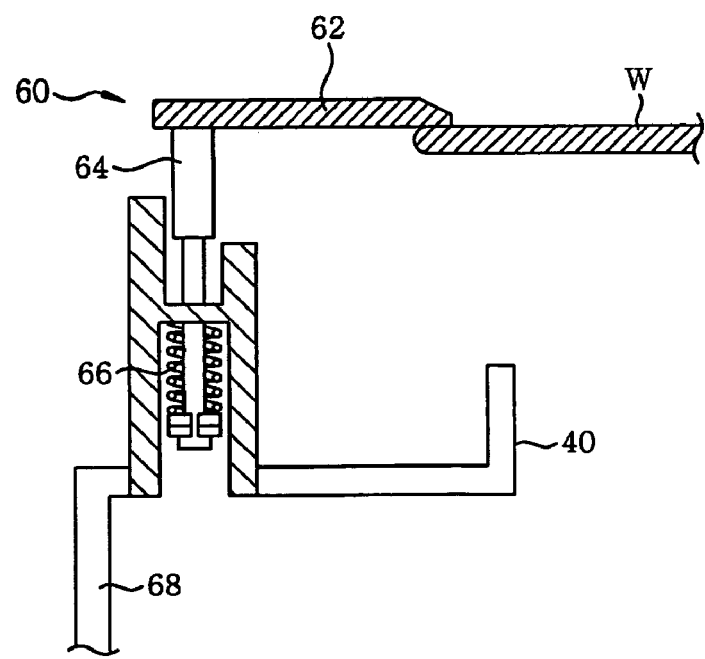
FIG. 12 describes an exemplary clamp mechanism with a lift pin attached thereto.

In the second and the fourth embodiment, the lift pins 40 and the clamp mechanisms 60 are separately provided. However, there can be employed a configuration in which they are provided as a unit, as shown in FIG. 12. FIG. 12 describes an example of a clamp mechanism attached with lift pins. In this case, the lift pins 40 and the clamp mechanism 60 can move vertically as a unit.

Hereinafter, a fifth preferred embodiment of the present invention will be described.

In the aforementioned first to the fourth embodiment, the conductive material (conductive metal) forming the upper and the lower wiring 28 and 30 is exposed on surfaces of the upper and the lower wiring 28 and 30 joining the P-type semiconductors and the N-type semiconductors forming the peltier elements 24. Further, the bottom surface (back surface) of the wafer W should be constantly insulated from the need to prevent the peltier elements 24 from being short-circuited.

However, a state of the wafer bottom surface may vary in the actual processing equipment. For example, a bare wafer originally has a conductive bottom surface. Further, even if an insulating oxide film is formed on the bottom surface of the wafer, a conductive portion may become exposed when the corresponding oxide film is partially peeled off; or, the oxide film itself may be insufficient and have certain conductivity. In case of a wafer processed for a regular or irregular quality management, a back surface thereof may be abraded to expose a conductive material thereat. Therefore, when such wafers are used, a specific insulating process is required to prevent the peltier elements 24 from being short-circuited.

In this case, it may be considered to provide an additional insulating plate such as a thin plate shaped ceramic plate or the like, as described above. However, such an additional insulating plate needs to have a certain plate thickness for durability. Accordingly, the thermal resistance increases, and the thermal response deteriorates.

In this embodiment, therefore, the occurrence of the short-circuit is prevented by forming thin insulating films on the surfaces of the upper and the lower wiring 28 and 30, the insulating films being made of a compound of the material forming the corresponding wirings.

Figure 13:
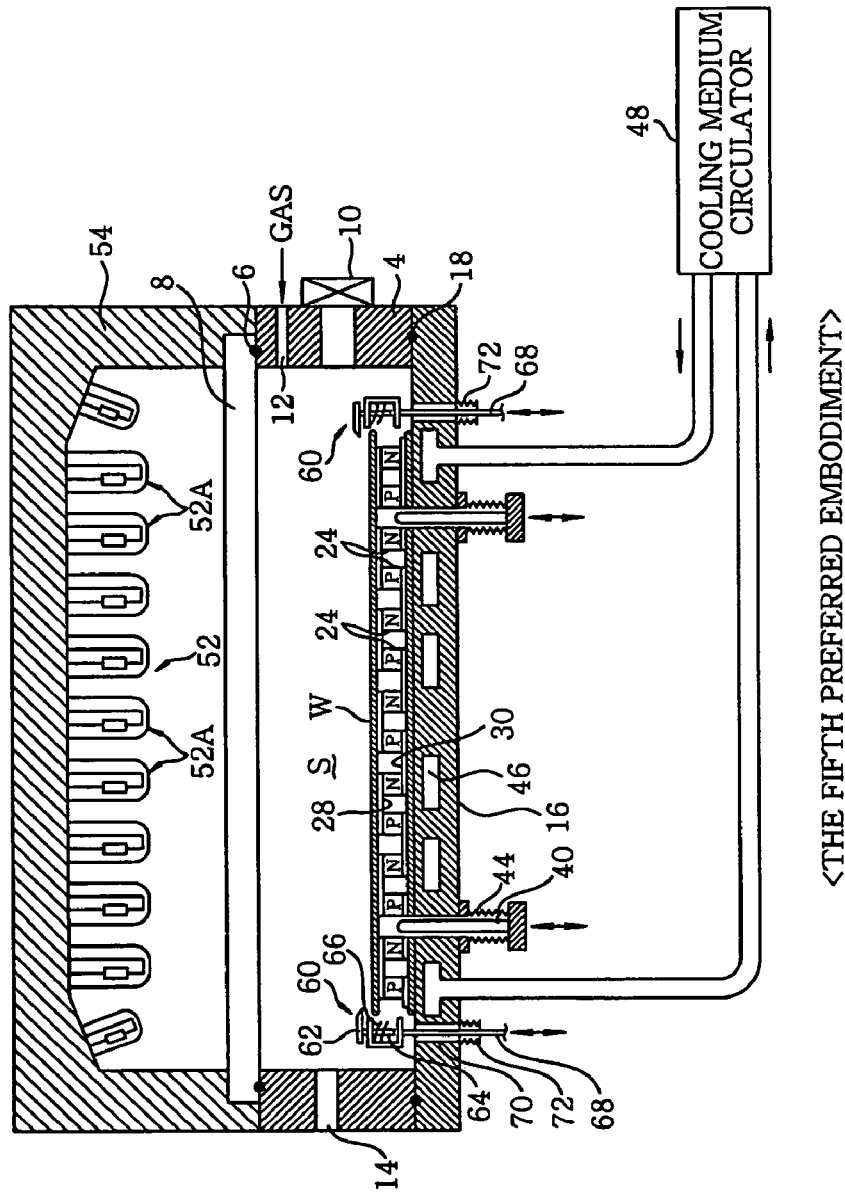
FIG. 13 offers a schematic cross sectional view of a processing equipment for an object to be processed in accordance with a fifth embodiment of the present invention.
Figure 14:
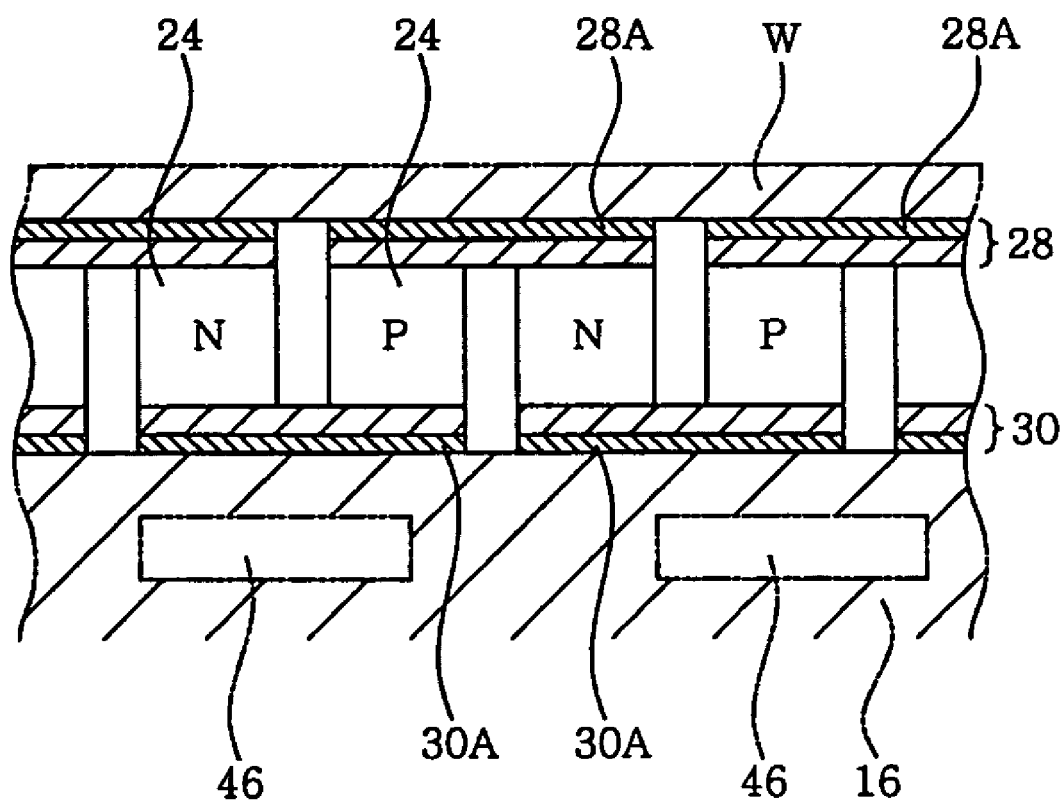
FIG. 14 sets forth a fragmentary enlarged cross sectional view depicting parts of peltier elements of FIG. 13.

FIG. 13 offers a schematic cross sectional view of a fifth embodiment of the present invention. FIG. 14 sets forth a fragmentary enlarged cross sectional view depicting parts of the peltier elements of FIG. 13. In FIGS. 13 and 14, like parts as those of the aforementioned embodiments will be designated by like reference characters, and descriptions thereof will be omitted.

Though the wiring structure of this embodiment may be applied to any one of the first to the fourth embodiment, it is applied to the second embodiment of FIG. 7 in this embodiment.

In this embodiment, one or both of the upper wiring 28 for joining uppermost portions of the peltier elements 24 and the lower wiring 30 for joining lowermost portions of the peltier elements 24 are covered by insulating films having an insulation property, i.e., a compound of the conductive material forming the corresponding wirings.

Such insulating films are not limited to the compound of the conductive material forming the wirings but may be other insulating films.

Herein, insulating films 28A and 30A are respectively formed on surfaces of the upper and the lower wiring 28 and 30, as shown in FIG. 14. In this case, each of the insulating films 28A and 30A is formed on a surface at least in contact with another member. To be specific, the upper wiring 28 has the insulating film only on its top surfaces contacted with bottom surface of the wafer W, and the lower wiring 30 has the insulating film only on its bottom surfaces contacted with the supporting table (bottom portion) 16.

Since the insulating film 30A is formed on the bottom surface of the lower wiring 30 as described above, the lower wiring 30 can be directly contacted with the supporting table 16, without interposing therebetween the insulating plate 26 formed in a thin board shape as shown in FIG. 7. Accordingly, the thermal resistance in the contact point can be reduced. Although a thickness of the insulating films 28A and 30A varies depending on materials, it is about 10 to 1000 µm, for example.

As for a compound of the conductive material, a carbide, a fluoride, a silicide, an oxide, a nitride or the like is selectively used depending on the corresponding conductive material. Specifically, the conductive material forming the upper and the lower wiring 28 and 30 may be properly selected from carbon, aluminum, tantalum, tungsten, Ni—Ti alloy (superelastic alloy), Fe—Cr—Ni—Mo dual phase stainless steel (superplastic material), silicon and the like. As for an example of carbon, there may be suggested carbon fiber plate or the like.

When carbon is used as a conductive material, SiC (silicon carbide) as a silicide may be used as an insulating film. Further, when aluminum is used as the conductive material, $Al_2O_3$ (alumina) as an oxide or AlN (aluminum nitride) as a nitride may be used as the insulating film. When tantalum is used as the conductive material, $TaO_3$ (tantalum oxide film) as an oxide may be used as the insulating film. Moreover, when tungsten is used as the conductive material, WC (tungsten carbide) as a carbide or $WO_2$ (tungsten oxide) as an oxide may be used as the insulating film. When silicon is used as the conductive material, SiF (silicon fluoride) as a fluoride may be used as the insulating film.

The insulating films 28A and 30A may be formed by ion sputtering or vapor deposition. Also, they may be formed by coating a sol-gel type material and then drying or baking the coated material. In addition, it is possible to form the insulating film on a surface of a plate-shaped wiring material and then join the corresponding wiring material between the peltier elements, the insulating film being formed by performing in advance a carbonization process, a fluoridation process, a silicification process, an oxidation process, a nitrification process or the like. By using the compound of the conductive material forming the wirings as the insulating films, the close contact is high and the separation hardly occurs.

By forming the insulating film 28A made of a compound of the corresponding material on the surfaces of the upper wiring 28, the wafer W can be mounted on the upper wiring 28 while maintaining a direct contact therewith regardless of a state of the bottom surface of the wafer W. Hence, the thermal resistance in the corresponding contact portion is reduced, and the thermal response can be improved.

Similarly, by forming the insulating film 30A made of a compound of the corresponding material on the surfaces of the lower wiring 30, the peltier elements 24 can be directly contacted on the supporting table 16 without interposing a thin plate shaped insulating material 26 therebetween. Accordingly, the thermal resistance in the contact portion is reduced and, thus, the thermal response can be improved.

Although the insulating films 28A and 30A are formed on both surfaces of the upper and the lower wiring 28 and 30 in this embodiment, the insulating films may be formed only on either the upper wiring 28 or the lower wiring 30 without being limited the above-described example.

A semiconductor wafer was used as an example of an object to be processed in the present invention. However, it is not limited thereto and can be applied to an LCD substrate, a glass substrate and the like.

What is claimed is:

1. A processing equipment for an object to be processed, comprising:

a process container having an evacuable inner space;

a gas introducing unit for introducing a gas into the process container;

a supporting table provided at the process container;

a ring-shaped supporting part, provided on the supporting table, for supporting the object to be processed;

a plurality of peltier elements provided on a top surface of the supporting table at an inner side of the supporting part, the peltier elements being disposed at regular intervals; and an element accommodating space evacuating unit for evacuating an inside of an element accommodating space formed between a bottom surface of the object to be processed, which is supported by the supporting part, the top surface of the supporting table, and the supporting part, wherein a mounting surface of the supporting part has a height slightly higher than a height of uppermost surfaces of the peltier elements to form a gap between the uppermost surfaces of the peltier elements and the bottom surface of the object to be processed, and wherein the gap is reduced by the element accommodating space evacuating unit so that the peltier elements are directly contacted with the object to be processed during a processing.

2. The processing equipment of claim 1, wherein the uppermost surfaces of the peltier elements have a uniform height.

3. The processing equipment of claim 1, wherein the uppermost surfaces of the peltier elements are slightly higher in a peripheral portion of the supporting table than in a central portion thereof.

4. The processing equipment of claim 1, wherein the peltier elements are provided by arranging plural element modules in a prescribed arrangement state, each element module being formed of one or more prescribed number of the peltier elements.

5. The processing equipment of claim 1, wherein a coolant passageway where a cooling medium is made to flow is formed in the supporting table.

6. The processing equipment of claim 1, further comprising a heating unit for heating the object to be processed.

7. The processing equipment of claim 1,
wherein the uppermost surfaces of the peltier elements are selectively connected with each other by an upper wiring,
lowermost surfaces of the peltier elements are selectively connected with each other by a lower wiring, and
a conductive material forming the upper and/or lower wiring is exposed at least either top surfaces of the upper wiring or bottom surfaces of the lower wiring.

8. The processing equipment of claim 7, wherein the top surfaces of the upper wiring are configured to be directly contacted with a bottom surface of the object to be processed.

9. The processing equipment of claim 7, wherein the conductive material is one of carbon, aluminum, tantalum, tungsten, Ni—Ti alloy (superelastic alloy), Fe—Cr—Ni—Mo dual phase stainless steel (superplastic material), and silicon.

10. The processing equipment of claim 7, wherein the upper wiring and the lower wiring are formed in a plate shape.

11. The processing equipment of claim 1,
wherein the uppermost surfaces of the peltier elements are selectively connected with each other by an upper wiring,
bottom surfaces of the peltier elements are selectively connected with each other by a lower wiring, and
at least either top surfaces of the upper wiring or bottom surfaces of the lower wiring are covered by an insulating film.

12. The processing equipment of claim 11, wherein the insulating film is made of a compound of a conductive material forming the upper wiring and/or the lower wiring.

13. The processing equipment of claim 11, wherein the bottom surfaces of the lower wiring are covered by the insulating film and are directly contacted with a surface of the supporting table.

14. The processing equipment of claim 11, wherein the insulating film is made of one of a carbide, a fluoride, a silicide, an oxide, and a nitride of the conductive material.

* * * * *